United States Patent [19]

Schwartz

[11] 4,246,648

[45] Jan. 20, 1981

[54] PHASE CONTROLLED REPLICATE/SWAP GATE FOR BUBBLE MEMORIES

[75] Inventor: Sidney J. Schwartz, Vista, Calif.

[73] Assignee: Burroughs Corporation, Detroit, Mich.

[21] Appl. No.: 18,512

[22] Filed: Mar. 8, 1979

[51] Int. Cl.³ .................................................. G11C 19/08
[52] U.S. Cl. ........................................ 365/13; 365/16; 365/43
[58] Field of Search .................... 365/5, 13, 16, 12, 43

[56] References Cited
U.S. PATENT DOCUMENTS 4,094,005  6/1978  Chen ...................................... 365/43

Primary Examiner—Vincent P. Canney
Attorney, Agent, or Firm—Joseph R. Dwyer; Charles J. Fassbender; Kevin R. Peterson

[57] ABSTRACT

Replicate/swap gating circuitry comprising separate gates oriented to be responsive to different phases of an in-plane magnetic field for transferring data to and from an adjacent storage loop in a bubble memory, said gate being formed of magnetic domain propagate elements arranged in propagation paths to perform several independently operable gating functions by a single current conductor on application of current pulses at selected phases of the rotating in-plane magnetic field.

10 Claims, 4 Drawing Figures

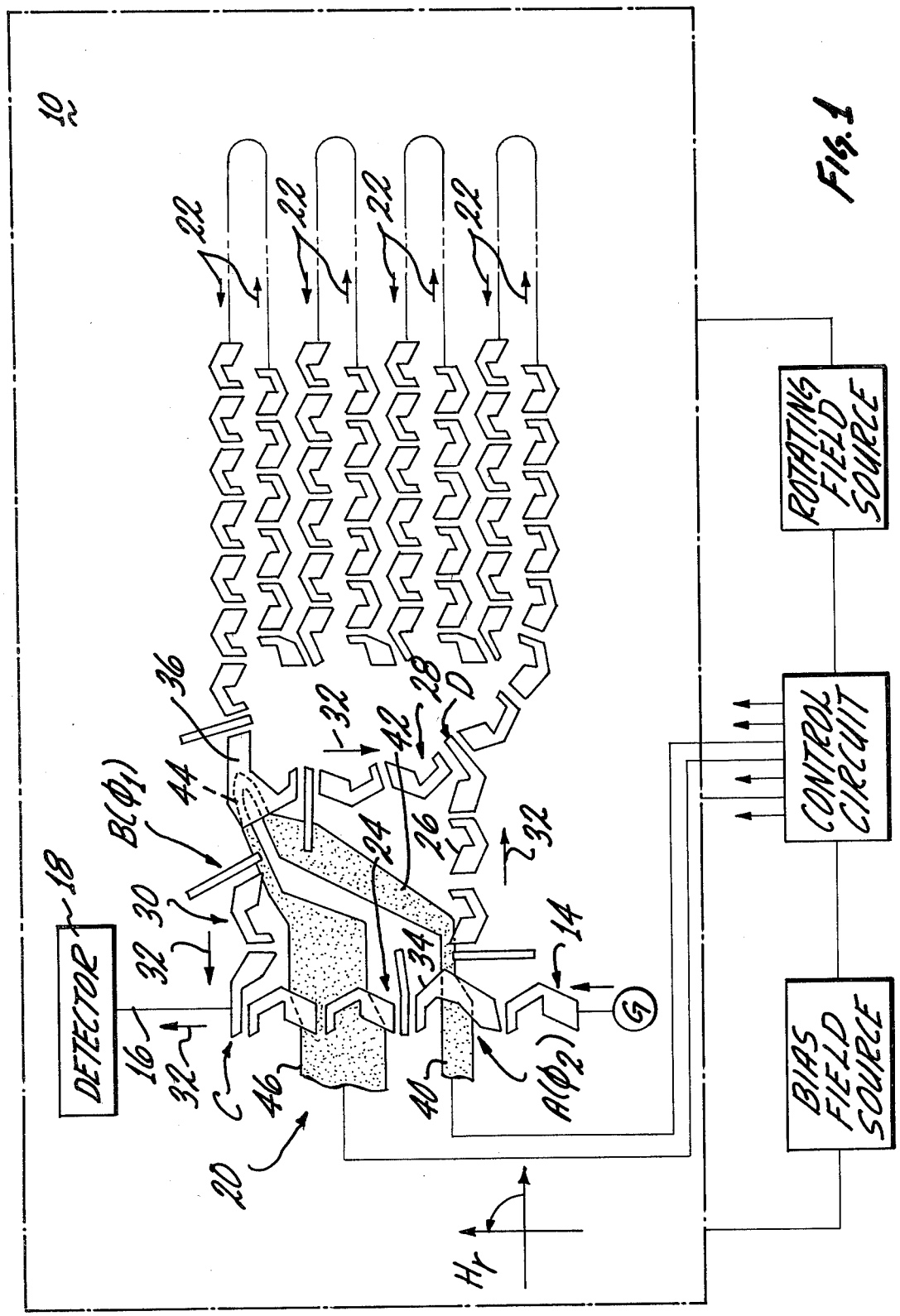

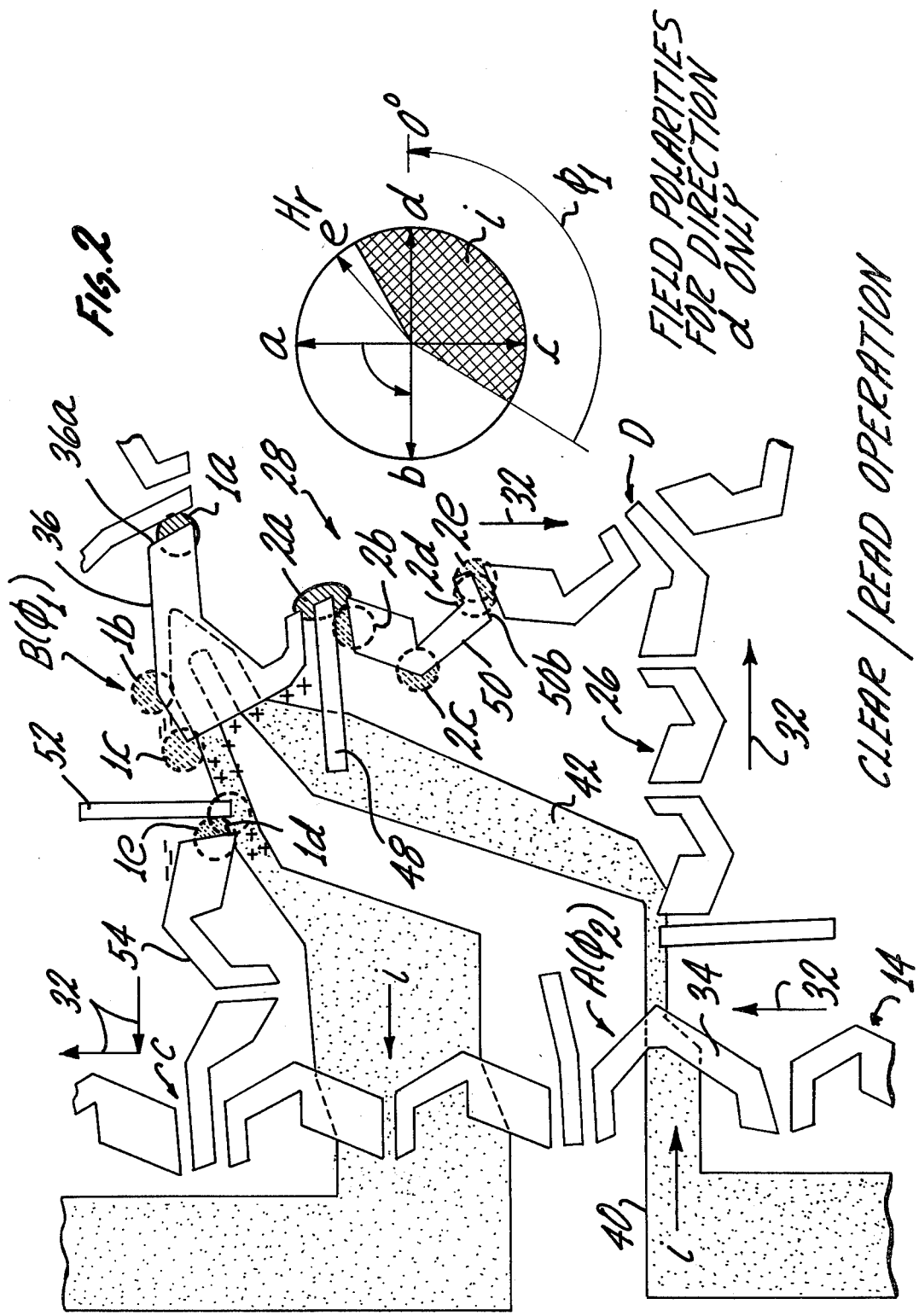

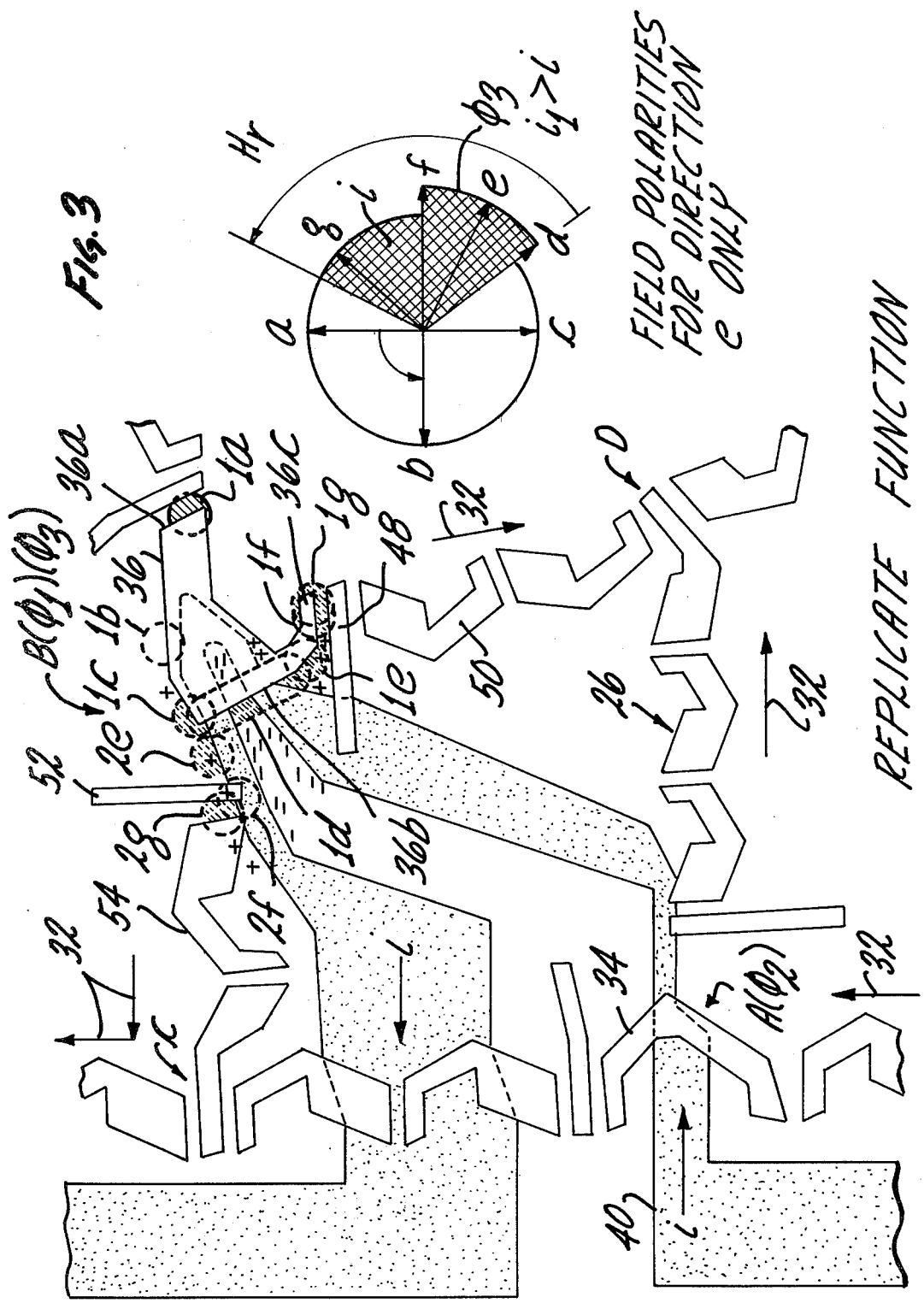

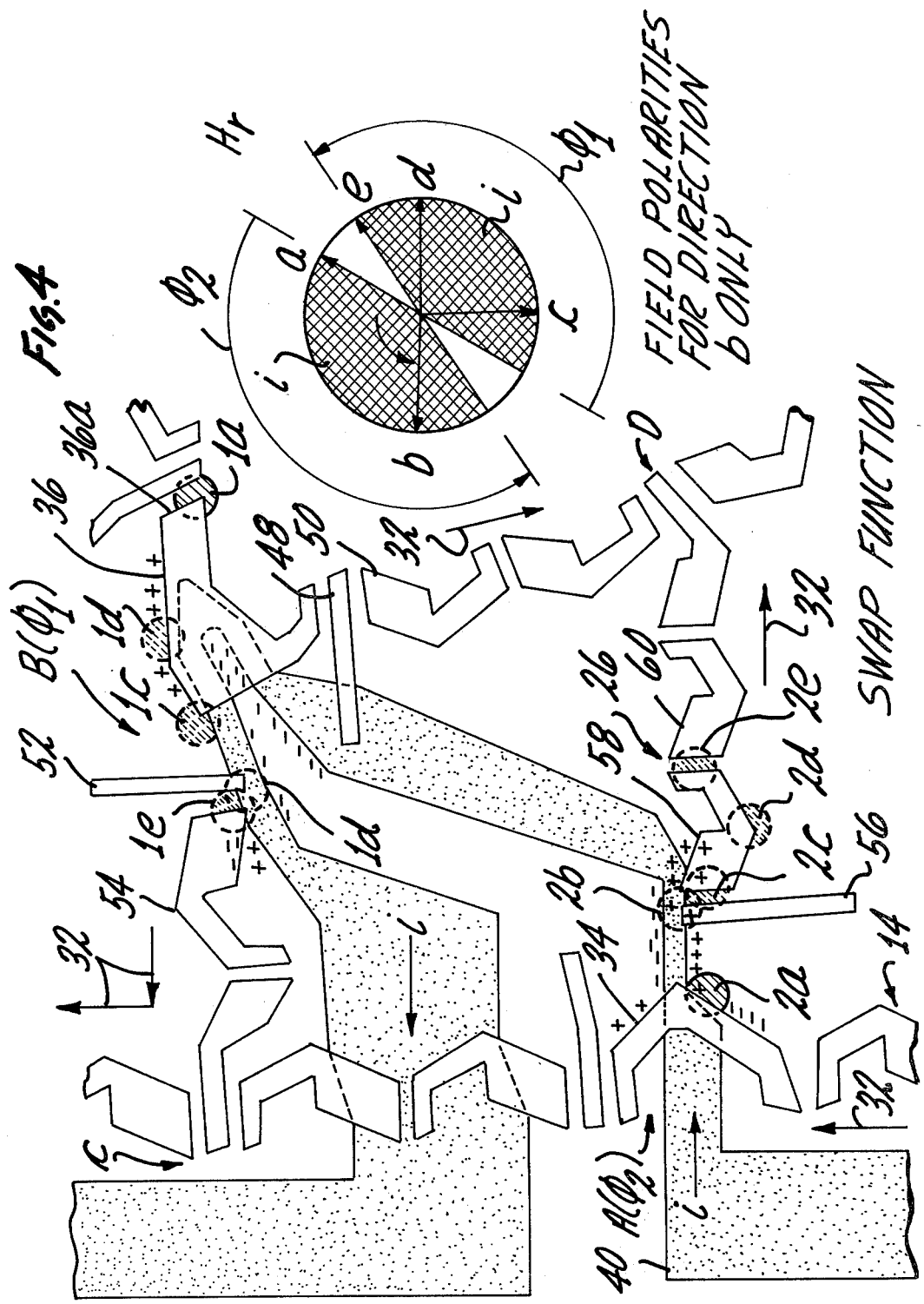

PHASE CONTROLLED REPLICATE/SWAP GATE FOR BUBBLE MEMORIES

CROSS REFERENCE TO RELATED APPLICATIONS

U.S. application for patent, Ser. No. 901,357, by Sidney J. Schwartz et al. filed May 1, 1978, and entitled "Bubble Memory Chip Organization Folded Loop Type;" "Phase Controlled Gating," by Sidney J. Schwartz Ser. No. 018,511; and "Phase Controlled Decoder for Bubble Memories," Sidney J. Schwartz Ser. No. 018,513.

BACKGROUND OF THE INVENTION

This invention is directed to magnetic bubble domain devices and in particular to a gating circuit therefor. More specifically this invention relates to a new replicate/swap gate for bubble memories.

Magnetic bubble gating circuits and organizations, such as storage loops formed of propagate elements in which bubble domains circulate in response to a rotating in-plane magnetic field to form a bubble memory device, are old and well known. See, for example, the U.S. patents to Chen U.S. Pat. No. 4,094,005, Gergis No. 4,079,359, Chang No. 4,122,537 and to Bullock No. 4,086,572.

The above-mentioned Schwartz et al. application disclosed a folded loop configuration as a storage loop in which a number of propagate elements can be selected so as to time the propagation of the bubbles not only in the loop itself but also to time other functional elements in the bubble memory organization. While a number of additional advantages accrue by the use of a folded loop configuration, one advantage set forth was the fact that gating circuits and other functional elements can be located on one end or side of the loop for more efficient exchange of information between the components. Another advantage was the use of a single conductor to perform a number of gating functions.

This invention is directed to a specific embodiment of a gating circuit responsive to different phases of an in-plane rotating magnetic field and with a plurality of gates oriented to be independently operable by a single conductor which is subjected to current pulses of different amplitudes during selected phases of the rotating field and useable in combination with a loop storage arrangement.

Accordingly, it is an object of this invention to provide a gating circuit in the form of a replicate/swap gate operable by a single conductor at selected phases of an in-plane rotating magnetic field and at selected current amplitudes for transferring information to and from a bubble memory storage loop.

SUMMARY OF THE INVENTION

This invention which fulfills the foregoing objects comprises plurality of separate differently oriented gates located adjacent a storage loop in a bubble memory and formed of magnetic domain propagate elements arranged for the transfer-in, transfer-out, and replication of data. This circuitry provides for a nondestructive readout of data by a transfer out/replicate operation, for a read/clear operation to read data or clear a position in memory, and for a swap function for data exchange all operable by a single conductor which subjects selected gating elements to a magnetic field created by pulsing this single conductor with currents selected magnitudes at selected phases of the rotational in-plane magnetic field.

BRIEF DESCRIPTION OF THE DRAWINGS

FIG. 1 is a schematic representation of a magnetic bubble domain replicate/swap gate in accordance with the present invention shown with folded type storage loop;

FIGS. 2–4 are enlarged and more detailed representations of the replicate/swap gate of FIG. 1 in different operating modes.

BRIEF DESCRIPTION OF THE PREFERRED EMBODIMENT

Referring now to the drawings, there is disclosed a portion of a bubble memory organization in which conditions exist for establishing single wall domains, or bubbles, or suitable magnetic material, such as epitaxial magnetic garnet film, on a non-magnetic garnet substrate; all of which are well known and identified as 10 herein. Patterns, such as asymmetrical chevrons 12 of magnetically soft overlay material, i.e., permalloy, forming propagate elements, are employed and bubbles propagate from element-to-element in response to a rotating in-plane magnetic field; the source for which is shown as a block diagram.

Also, in a bubble memory storage area, identical closed storage loops are formed of selected type of propagate elements and connected by a suitable input track 14 of propagate elements from a bubble generator 6 and an output track 16 of propagate elements to a bubble detector 18, which senses the presence or absence of a bubble in the detector 18 and sends the appropriate signal to a utilization device. The presence or absence of a bubble in the individual propagate elements represents information stored in memory and read out by the detector. Thus, a bubble transferred into a storage loop will circulate indefinitely in response to the rotating in-plane magnetic field unless are transferred out and, a suitable bias source and control circuits, for the application of pulses to functional elements, such as transfer-in and transfer-out gates, are well known. For the purpose of this disclosure, the sources and circuits are shown in FIG. 1 only in block diagram.

As disclosed in the copending Schwartz et al. application, supra, by utilizing a folded loop configuration for storage, the number of propagate elements and consequently the number of cycles of the rotating in-plane magnetic field can be selected so as to time the propagation of the bubbles, not only in the loop itself, but also to time other functional elements of the bubble memory organization. The folded loop configuration also allows the transfer-in and transfer-out and/or replciate gates to be located at one end or side of the loop rather than at the corner turns at opposite ends of the conventional elongated storage loops. The folded loop configuration is shown in FIG. 1 of the drawing where a plurality of folds (4 shown as an example) form one continuous loop with transfer circuit element, i.e, a phase controlled replicate/swap gate 20, located on the ends of the folds so that bubbles transferred in circulate in the closed loop. Arrows 22 indicate the bubble flow path in the closed loop.

The phase controlled replicate/swap gate 20 comprising this invention, shown in combination with the folded loop type storage arrangement, is essentially a rectangle formed of propagate elements and transfer elements. The rectangular arrangement thus forms four bubble flow paths 24, 26, 28 and 30 with arrows 32 indicating the bubble flow directions. Bubble flow path 24 forms a continuation of the input track 14 and ouput track 16 and bubble flow path 28 forms a continuation of the storage loop for the circulation of bubbles in memory.

Located on the diagonally opposite corners of the rectangle is a chevron shaped transfer-in element 34 forming a transfer-in gate A ($\phi_2$) and a hook or barb shaped replicate/transfer-out element 36 forming a replicate/transfer-out gate B ($\phi_1$) which are operatively connected by a single current conductor 40 having one leg 42 located beneath the transfer-in element 34, forming a hairpin loop 44 beneath the replicate/transfer-out element 36 with leg 46 continuing on out from the replicate/swap gate 20. Conductor 40 is connected to a suitable source of current pulses for the formation of suitable magnetic fields at elements 34 and 36 for the operation of gates A ($\phi_2$) and B ($\phi_1$). Also located at the other corners of the rectangle are merge ports C and D connecting flow paths 24 and 30 with output path 16 and flow paths 24 and 28 with the storage loop, respectively.

The transfer-in element 34 is oriented oppositely, i.e., essentially 180° to the replicate/transfer-out element 36 so that bubbles move during transfer in opposite directions on each element and the elements function to transfer bubbles onto different paths only when a control current pulse occurs during a specific phase of the rotating field cycle and are unresponsive to the current pulse at other phase times. That is to say, by selectively pulsing the conductor 40 at different vectors of the rotating in-plane magnetic field transfer elements 34 and 36, although connected by a single conductor, function independently. This operation of elements and the different flow paths for bubbles as they are propagated or transferred through the phase controlled gating circuitry will now be discussed in connection with FIGS. 2-4 where FIG. 2 illustrates a clear/read operation, FIG. 3 illustrates a replicate function and FIG. 4 illustrates a swap function.

In FIGS. 2-4, the 360° counter-clockwise rotation of the in-plane magnetic field $H_r$ is represented by a circle forming a vector diagram starting with a horizontal 0° and, phase 1 is represented by the Greek symbol $\phi$ shown to expand more than 90° in one of the hemispheres of the circle. The current i and its direction is shown together with the vector diagram indicating phase positions a, b, c, d and e and bubbles 1 and 2 appearing at different portions of the replicate/swap gate have suffixes a, b, c, d and e corresponding to bubbles numbered 1 and 2 to relate the phase positions a, b, c, d and e of the vector diagram. Also, by definition, a positive magnetic field direction is that which will support, or attract, a bubble and is represented by the plus sign (+), while negative signs (−) represent a magnetic field direction which would oppose, or collapse, a bubble. Both field directions are shown adjacent the conductor and propagate/transfer elements.

Turning now specifically to FIG. 2, it should be noted that the bubble flow path is again indicated from the input track 14 by arrow 32 and the current flow path is indicated by the arrow in connection with the letter i in the conductor 40. In the vector diagram, the duration of the current pulse i corresponds to the angular length of the arrow representing phase 2, and the field polarities are shown for field direction b only. Note also that the operation involves only one gate, gate B ($\phi_1$) and involves a read operation of data or a clearing of one bit of data from each storage loop coupled in like manner to conductor 40, a destructive clear/read function.

Considering bubbles 1 and 2, bubble 1 is at the right hand end 36a of the replicate/transfer element 36, identified by bubble position 1a, and bubble 2 shares the other end 36b of the replicate/transfer element 36 with the end of pick-off bar 48 and asymmetrical chevron propagate element 50. As the rotating field moves the poles around the propagate elements on the surface of the garnet, bubbles 1 and 2 move to positions 1b and 2b, respectively. Shortly before the bubbles 1 and 2 arrive at positions 1c and 2c, the current i is turned on in the conductor 40, flowing in the direction indicated, causing an attractive magnetic field along the outer edge of the conductor indicated by the positive (+) field signs. The bubbles then continue to move to positions 1c and 2c, respectively, on elements 36 and 50. The current through the conductor prevents bubble 1 from staying on element 36, so bubble 1, in response to the attractive pole when the field is in vector position d, moves to the tip of the pick-off bar 52 as shown by bubble position 1d. Bubble 2 has moved to the far end 50b of element 50 at position 2d. Shortly after position d has been attained for both bubbles, bubble 1 is attracted by both pick-off bar 52 and asymmetrical chevron 54, the current is turned off. This is the conclusion of the phase 1 cycle. As the rotating in-plane magnetic field continues to vector direction e, bubbles 1 and 2 assume positions 1e and 2e, respectively. In this operation typically for the geometry shown, a single phase 1 pulse event, or successive pulses during phase 1 for two rotating field cycles, or four successive pulses during phase 1 for four rotating field cycles, or two pulses at phase 1 occurring at alternate rotating field cycles can occur depending upon the chip architecture. It is understood, of course, that if a pulse had not occurred at phase 1, bubble 1 would have followed bubble 2 on track 28.

While the bubble replicate function is illustrated in FIG. 3, the replicate function again requires operation of only one gate as did the clear/read operation.

In this Figure, bubble 1 appears at the right hand end 36a of replicate transfer element 36 for vector direction a of the rotating in-plane magnetic field $H_r$ and this is represented by bubble position 1a. At field direction b, the bubble has moved to position 1b and, at field direction c, the bubble has moved to the extreme left hand side 36b of the replicate transfer element 36. For the replicate function, a bubble must be allowed to pass along the flat, left hand end 36b, of element 36 and to continue until it stretches out into an elongated bubble, or stripe, indicated by bubble position 1d. When the stripe 1d is formed at this field direction d, the replicate current i is turned on as shown in the vector diagram. The current during this replicate function is a larger current than that used in the clear function and in the vector diagram the shaded portion with the large radius indicates the period in which the high cutting current is applied to the conductor 40 followed by a lower current indicated by a smaller radius shaded region. This lower current is used to steer the two pieces of the bubble, after replication, to the respective pick-off bars 48 and 52. Thus, at the field direction g, bubble 1 has been split and the original piece is indicated as 1e continuing on around the replicate/transfer element 36, while the second piece of bubble 1 is now represented by bubble position 2e and is in transit between element 36 and pick-off bar 52 being attracted to the bar by the positive field caused by the current through the conductor 40. Shortly after the rotating in-plane magnetic field reaches field direction g, bubble 2 is firmly anchored to element 54 and bubble 1 is firmly anchored to the tip 36c of element 36 is represented by bubble position 1g and is starting to be attracted by the positive field at the top 48a of the pick-off bar 48. Thus, the replication process has been completed. It must be pointed out, however at this time, that, during a replicate function, there are no bubbles present in the input track 14 and this condition remains for several cycles of the rotating in-plane magnetic field after a replicate pulse has occurred. For the replicate operation, typically for the geometry shown, a single phase 3 pulse event occurs with the pulse event being a double amplitude stepped pulse consisting of a high amplitude bubble cutting portion and a lower amplitude bubble transfer level. The chip organization might require that successive pulses during phase 3 be utilized; two consecutive phase 3 pulses for two rotating field cycles, or four successive phase 3 pulses for four consecutive rotating field cycles, or two phase 3 pulses occurring at alternate rotating field cycles depending upon the chip architecture. Again, it is to be understood, time without a pulse at phase 1, bubble 1 would have singly continued on to track 28.

FIG. 4 illustrates the swap function of the replicate/-swap gate 20 and it is to be noted that there are bubbles moving in the major input track 14 for this function. For the basic operation of two oppositely oriented transfer gates under phase control, a more detailed description is to be found in the U.S. Application for Letters Patent entitled "Phase Controlled Gating" by Sidney J. Schwartz, supra. This particularly illustrates the operation of two differently oriented gates in response to current pulses at different phases of the rotating in-plane magnetic field. Thus, at field direction a, the beginning of phase 2, the current i is turned on to transfer bubble 2 off transfer element 34 towards pick-off bar 56. Bubble 1 is in position 1a at the right hand end 36a of transfer element 36 of gate B and bubble 2 is at position 2a along the edge of the element 34 of gate A ($\phi_2$). As the field rotates to field direction b, bubble 1 slides down to position 1b where it is attracted by the positive fields formed along the edge of element 36 due to the current which has started to flow in the conductor. It should be noted, however, that a current is not required to operate on bubble 1 since it would move to position 1b in response to the rotating in-plane magnetic field anyway. At field direction b, bubble 2 is attracted to the end of bar 56 and this is represented by position 2b. Shortly after this field direction, the current for the phase 1 operation is turned off and the transfer function of gate A has been accomplished. Note that the current remains off for a certain length of time to allow bubble 2 to move off bar 56 to element 58 where it is free of the influence of current in conductor 40. This is represented by the position 2c. At the same time that bubble 2 has reached position 2c, bubble 1 has moved to position 1c near the left hand corner of element 36 where it will need the presence of a current in conductor 40 to steer it through a favorable potential well down to the end of pick-off bar 52.

Referring now to the vector diagram, it can be seen that the current was turned on in phase 2 portion of the rotating in-plane magnetic field before field direction c was reached, as represented by bubble positions 1c and 2c, so that for a phase 2 operation, bubble 2 moves from position 2c to position 2d as the field rotates while bubble 1 moves to the strongly attractive pole on pick-off bar 52 as represented by bubble position 1d. The current for phase 2 remains on for a short time until field direction e is reached at which time bubble 1 is now firmly attached to element 54 and bubble 2 has moved to position where it is spanning the gap between element 58 and element 60 represented by position 2e. Thus, the swap operation has been completed. Again, for the geometry shown two consecutive, two during alternate cycles, or four consecutive swap pulse sequences can be applied and the data exchange from track 14 to the minor track and vice versa can thus be accomplished for one, two or four consecutive bits in the loop or for two bits spaced one period apart.

Thus described are three functions occurring on a buble chip device organized with a phase controlled gating arrangement in which a single conductor operates two gates at different times and while asymmetrical chevron propagate elements are disclosed, this invention may be used with other shapes of propagate elements and transfer gates of various shapes.

What is claimed is:

1. A magnetic bubble domain propagation structure including means capable of supporting magnetic domains thereon and having propagate elements on which domains propagate element-to-element in response to a rotating in-plane magnetic field,
   a plurality of said propagate elements arranged in a loop configuration
   a plurality of propagate elements formed in a rectangular configuration defining four flow paths and having four corner propagate elements,
   the diagonally opposite corner propagate elements respectively defining a transfer-in gate and a transfer-out/replicate gate, said transfer-out replicate gate being adjacent said loop configuration, and
   a single electrical conductor crossing only a single one of said four flow paths and being routed within said rectangular configuration of propagate elements to said transfer-in gate and transfer-out/replicate gate to cause magnetic bubble domains to transfer from one flow path to another in response to the application of a pulse thereto.

2. The structure as claimed in claim 1, wherein a merge port is defined at the corner between said transfer-in gate and transfer-out/replicate gate and forming the inlet to said loop configuration.

3. The structure as claimed in claim 1, wherein the transfer-in gate and the transfer-out/replicate gate are each at the beginning of a flow path and facing in opposite directions to be responsive to a current pulse applied at different times in the rotation of said in-plane field.

4. The structure as claimed in claim 3, wherein one flow path forms part of the loop configuration.

5. The structure as claimed in claim 4, wherein said loop configuration is a folded loop type.

6. The structure as claimed in claim 3 including an inlet track of propagate elements connecting said transfer-in gate with a bubble generator and an output track of propagate elements connecting both said transfer-in gate and transfer-out/replicate gate with a bubble detector.

7. The structure as claimed in claim 6, wherein said transfer-out/replicate gate acts to transfer bubbles out of said loop in response to a current pulse of one value and to replicate bubbles and transfer the replicated bubble parts—one to continue in the loop and the other to flow to the output track.

8. A magnetic bubble domain propagation structure including means capable of supporting magnetic domains thereon and having propagate elements on which domains propagate element-to-element in response to a rotating in-plane magnetic field,
   a plurality of said propagate elements arranged in a loop configuration,
   a plurality of propagate elements formed in a rectangular configuration defining four flow paths, with one of said flow paths being part of said loop, and the oppositely positioned flow path of said rectangle being a by-pass path for said loop;
   diagonally opposite corner transfer elements located at diagonally opposite corners of said rectangular configuration respectively defining a transfer-in gate and a transfer-out/replicate gate, said transfer-out/replicate gate being adjacent said loop configuration, and
   a single electrical conductor crossing said by-pass path of said loop, forming a hairpin turn beneath said transfer-out/replicate gate, and again crossing said by-pass path at said transfer-in gate to cause magnetic bubble domains to transfer from one flow path to another in response to the application of a pulse thereto.

9. The structure as claimed in claim 8, wherein the transfer-in gate and the transfer-out/replicate gate are each at the beginning of a flow path and facing in opposite directions to be responsive to a current pulse applied at different times in the rotation of said in-plane field.

10. The structure as claimed in claim 9, wherein said transfer-out/replicate gate acts to transfer bubbles out of said loop configuration in response to a current pulse of one value and to replicate bubbles and transfer the replicated bubble parts—one to continue in the loop configuration and the other to flow on one of said flow paths.

* * * * *